(12) United States Patent
Coffy et al.

(10) Patent No.: US 8,786,084 B2
(45) Date of Patent: Jul. 22, 2014

(54) SEMICONDUCTOR PACKAGE AND METHOD OF FORMING

(75) Inventors: Romain Coffy, Saint Martin le Vinoux (FR); Jean-François Sauty, Saint Egreve (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 1092 days.

(21) Appl. No.: 12/751,088

(22) Filed: Mar. 31, 2010

(65) Prior Publication Data

US 2010/0244249 A1 Sep. 30, 2010

(30) Foreign Application Priority Data

Mar. 31, 2009 (WO) .................. PCT/IB2009/053463

(51) Int. Cl.
*H01L 23/488* (2006.01)
*H01L 23/00* (2006.01)
*H01L 21/60* (2006.01)

(52) U.S. Cl.
USPC ............ 257/741; 257/E23.024; 257/E23.025; 257/E21.519; 257/E23.02; 257/E23.002; 257/E23.023; 257/783; 257/666; 257/676; 257/698; 257/784; 257/692; 257/693; 228/203; 228/180.5; 29/830

(58) Field of Classification Search
USPC ......... 257/783, 666, 676, 698, 784, 692, 693, 257/E23.024, E23.025, E21.519, E23.02, 257/741, E21.509, E23.002, E23.023; 438/617, 124; 29/830; 228/180.5, 203
See application file for complete search history.

(56) References Cited

U.S. PATENT DOCUMENTS

| | | | | |
|---|---|---|---|---|
| 4,226,918 A * | 10/1980 | Friend | ........................... | 428/676 |
| 7,786,378 B2 * | 8/2010 | Kondo et al. | ................... | 174/36 |
| 7,847,398 B2 * | 12/2010 | Na et al. | ........................ | 257/737 |
| 8,593,817 B2 * | 11/2013 | Bayerer et al. | ................ | 361/729 |
| 2002/0084311 A1 * | 7/2002 | Barth | ........................ | 228/180.5 |
| 2004/0106235 A1 | 6/2004 | Igarashi et al. | | |
| 2006/0091523 A1 | 5/2006 | Shimanuki | | |
| 2006/0225918 A1 | 10/2006 | Chinda et al. | | |
| 2007/0001283 A1 | 1/2007 | Laska et al. | | |
| 2007/0202682 A1 | 8/2007 | Yamamoto et al. | | |
| 2009/0127317 A1 * | 5/2009 | Siepe et al. | ................ | 228/110.1 |
| 2012/0153444 A1 * | 6/2012 | Haga et al. | .................... | 257/666 |
| 2013/0175677 A1 * | 7/2013 | Chang et al. | .................. | 257/673 |
| 2013/0313708 A1 * | 11/2013 | Shigihara et al. | ............. | 257/738 |

FOREIGN PATENT DOCUMENTS

EP 1202296 A 5/2002
JP 9-306247 * 11/1997

OTHER PUBLICATIONS

International Bureau Search Report dated Jan. 22, 2010 from corresponding International Application PCT/IB2009/053463.

* cited by examiner

*Primary Examiner* — Alexander Oscar Williams
(74) *Attorney, Agent, or Firm* — Wolf, Greenfield & Sacks, P.C.

(57) ABSTRACT

A semiconductor package includes a semiconductor die attached to a support having electrically conductive paths, the semiconductor die having a bond-pad electrically connected to the electrically a conductive path on the support by a bond-wire of a first metallic composition, the bond-wire and the bond-pad being coated with a protection layer of a second metallic composition.

11 Claims, 4 Drawing Sheets

SEMICONDUCTOR PACKAGE AND METHOD OF FORMING

CROSS REFERENCE TO RELATED APPLICATIONS

This application claims the priority benefit of PCT patent application number PCT/IB2009/053463, filed on Mar. 31, 2009, entitled "Semiconductor Package," which is hereby incorporated by reference to the maximum extent allowable by law.

BACKGROUND OF THE INVENTION

1. Field of the Invention

The present invention relates to semiconductor packages, in particular to those using wire-bonding.

2. Background of the Invention

The technology of wire-bonding has been used for a long time in the manufacture of semiconductor packages.

FIG. 1 represents a cross-section of part of a semiconductor package 1. The semiconductor package has a support or substrate 2 which has on an upper surface attached a semiconductor die 3. On a top surface of the semiconductor die 3, there is arranged a pad 4, known as a bond-pad and of conductive material. Common materials for bond-pads 4 are copper and aluminum. A part of the upper surface of the bond-pad is exposed and this area is delimited by an opening in a passivation layer 5 covering most of the top surface of the semiconductor die.

There is a metal pad 6, commonly called a bond-finger, arranged on the top surface of the substrate.

A metal wire 7, called a bond-wire, connects the bond pad 4 and the bond finger 6. At the end of the bond-wire 7 connected to the bond-pad 4, there is a structure 8 resembling a squashed ball and known as a ball. The method of connecting the bond-wire 7 to the bond-pad 4 involves melting a free end of the wire so that a ball is formed. This ball is then forced down onto the pad while heat is applied. This results in the ball being crushed and a weld being formed at the interface of the ball 8 and the bond pad 4.

The bonding machine (not shown) then forms a loop of the bond-wire 7 down to the bond-finger 6. The bond-wire 7 is then crushed into the bond-finger 6 and a weld is formed at the interface between bond-wire 7 and bond-finger 6. The bonding machine then breaks the bond-wire 7 and the resulting structure is known as a stitch 9.

Hitherto the materiel mostly used for the bond-wires 7 is a high purity alloy of gold. This choice was dictated by following reasons. Firstly, gold is a very good electrical conductor which is useful because this allows bond-wires 7 which are relatively fine diameter (of the order of 20μ or less). Secondly, gold is a soft material which makes it well adapted to the techniques described above. Finally, gold suffers from practically no corrosion, making the wires very chemically stable.

Unfortunately, however, because gold is a very expensive material there is a strong financial incentive to use a cheaper metal. Therefore, recently, attention has been turned to copper and alloys thereof.

It has been possible to accomplish the above described steps using wires based on copper. Copper also fulfils the requirements of electrical conductivity. However copper presents a significant disadvantage in that it does not resist corrosion well. Its oxide is permeable and therefore does not protect the metal from corrosion to the extent that, as long as moisture is available, the corrosion continues.

Furthermore, most semiconductor packages are manufactured using a plastic resin which does protect the semiconductor die and the bond-wire from mechanical damage. However the plastic resin is, itself, also permeable to moisture. The result is that over sufficient time, the corrosion of the copper wires will continue until some of them fail and the device is rendered inoperative. It is found that the lifetime of the device may thus be unacceptably shortened.

This problem can be mitigated by the use of thicker copper wires but this is inconvenient where the devices have a large number of pins.

Attempts have also been made to address this problem by using copper alloy wires which have been previously coated in a protective metal. However, the mechanical action of the bonding process has a tendency to break this protective layer at the points shown by the arrows 7A in FIG. 1. Furthermore, the melting of the end of the wire in order to form the ball has a tendency to consume the coating and leave the ball unprotected.

Since the wires have been subjected to mechanical stress, there are residual stresses remaining in the areas indicated by the arrows mentioned previously. These residual stresses can accelerate the corrosion precisely at those areas where the protective coating has been inadvertently removed.

It is therefore desirable to provide a means that permits the use of bond-wires of inexpensive materials which do not have intrinsically high corrosion resistance yet will be stable over time.

SUMMARY OF THE INVENTION

Embodiments described herein address this need by providing a semiconductor package comprising a semiconductor die attached to a support having electrically conductive paths, the said semiconductor die having a bond-pad electrically connected to the electrically conductive path on said support by a bond-wire of a first metallic composition, wherein said bond-wire and said bond-pad are coated with a protection layer of a second metallic composition.

According to an embodiment of the present invention, said bond-wire is made of an alloy of copper.

According to an embodiment of the present invention, said protection layer is made of an alloy of nickel.

According to an embodiment of the present invention, the protection layer also partially covers said electrically conductive path on the support.

According to an embodiment of the present invention, said support is a substrate for a ball-grid array or a land-grid array package.

According to an embodiment of the present invention, said protective layer on said bond-wire is at least partially contiguous with said protective layer on said bond-pad.

It is also provided a process for manufacturing a semiconductor package comprising the steps of:
providing a support;
providing a semiconductor die having bond pads;
then attaching said semiconductor die to a support;
then electrically connecting a bonds pad of the semiconductor die to an electrically conductive path by a bond-wire of a first metallic composition; and
then electroplating a layer of a second metallic composition onto the bond wire and bond pad.

According to an embodiment of the present invention, the step of providing the support involves providing a plurality of supports arranged in a matrix on a larger support, each support having electrically conductive paths, wherein the electrically conductive paths of said plurality of supports are all electrically connected together.

According to an embodiment of the present invention, the process further comprises the step of attaching a connector for electroplating to a connection point on said larger support.

According to an embodiment of the present invention, the process further comprises the steps of:

before the step of electroplating, placing a protective layer on a face of said support not having said semiconductor die attached; and, after the step of electroplating, removing said protective layer.

According to an embodiment of the present invention, the process further comprises the steps of:

after the step of electroplating, placing a block of molding resin on said larger support such that said semiconductor die and said bond-wire are completely covered; and then sawing said larger support so that said supports are rendered separate.

DETAILED DESCRIPTION

In the following description, the same references designate the same elements. The figures are intended for representation only and are not drawn to scale.

Figure 2:
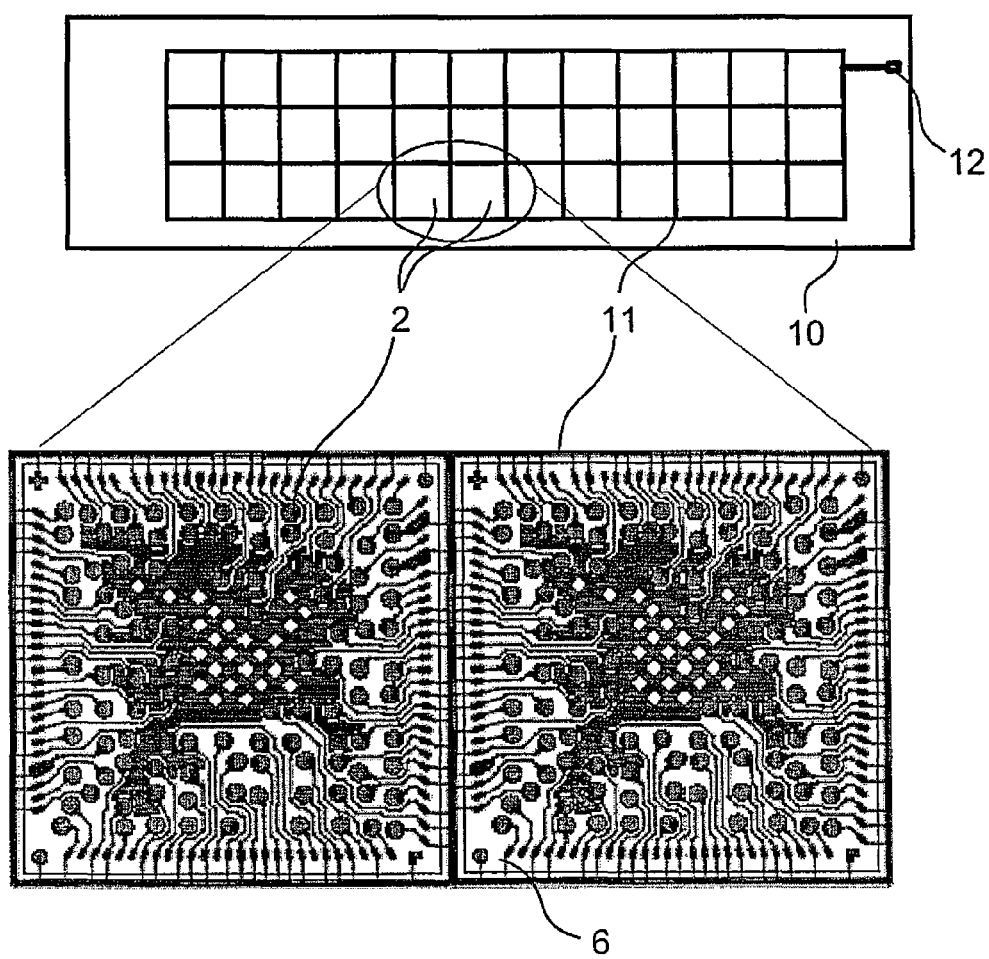
FIG. 2 represents a plan view of package substrates in an array.

FIG. 2 represents a plan view of a matrix 10 of the substrates 2, as they are arranged before the packaging process begins. In the case of a ball or land-grid array package, this matrix 10 is in the form of a substantially rectangular piece of printed circuit board material. Conductive tracks 11 are arranged around each of the individual substrates 2 so that the bond-fingers 6 are all electrically connected together. Furthermore the conductive tracks 11 are connected to contact points 12 which allow electrical connections between the conductive tracks 11 and electrical equipment (not shown).

Figure 3:
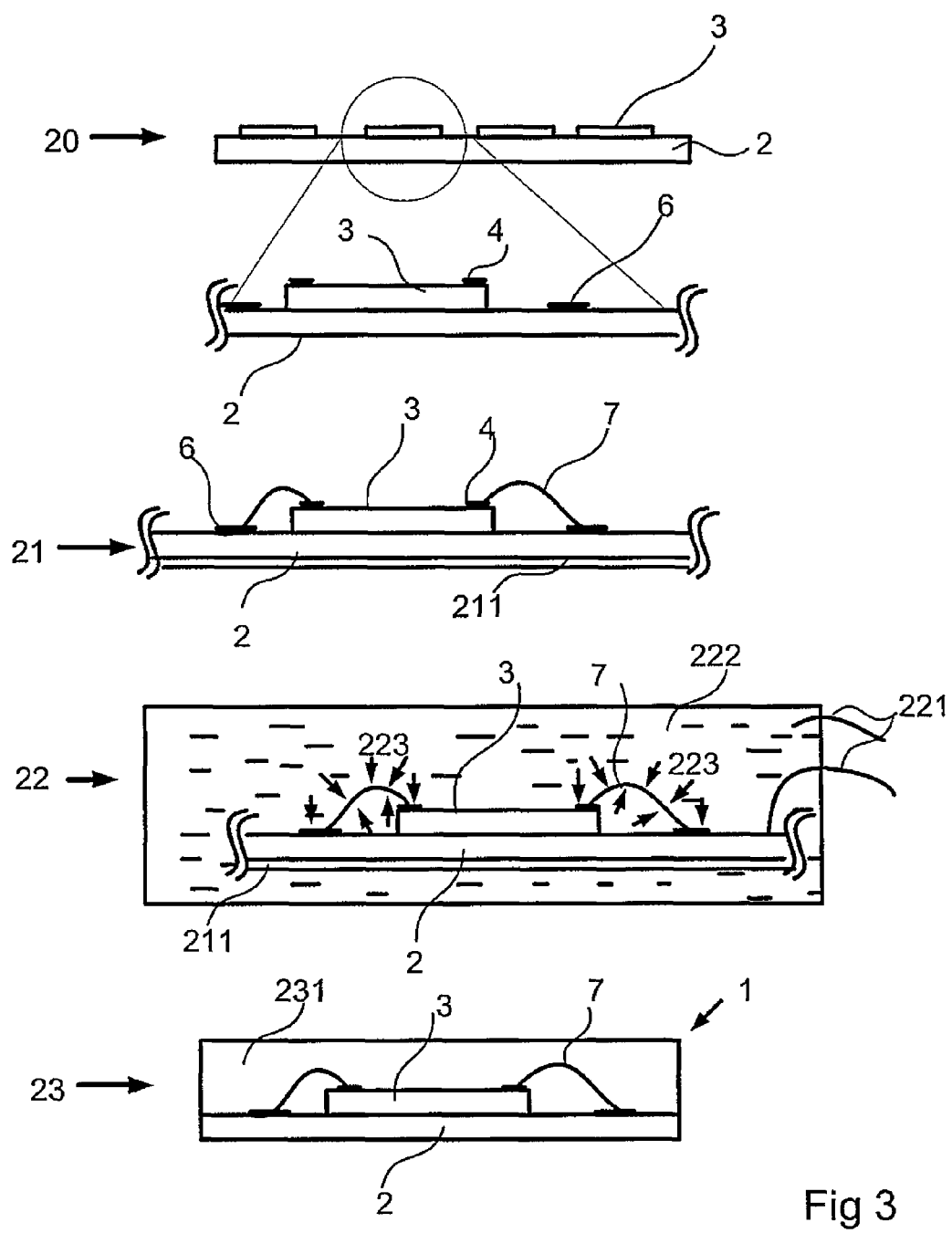
FIG. 3 represents a process flow according to an embodiment.

FIG. 3 represents a process flow according to an embodiment in terms of cross-section views of the work in progress.

At step 20, a strip 10 containing substrates 2 is provided with a plurality of semiconductor dice 3, attached to a top surface.

At step 21, bond-wires 7 are attached to bond-pads 4 on the semiconductor dice 3 and to bond-fingers 6 on the substrates 2 in the strip 10. A protective layer 211 may be placed on a lower surface of the strip 10 in order to protect exposed electrical contact areas thereon (not shown) from subsequent process steps.

At step 22, suitable electrical cables 221 are attached to the contact points on the strip. Then the strip is placed into a bath 222 for electroplating containing a suitable solution. A layer of a metal is deposited, as shown by the arrows 223, by electroplating onto all metal surfaces electrically connected to the contact points. Thus the layer of metal envelopes the bond wires and coats the exposed areas of the bond-pads 4 and bond-fingers 6.

One of ordinary skill will be able to choose the aqueous solution to be used and the accompanying conditions, for example in the case of copper bond-wires 7 and nickel coating.

The protective layer 221 serves to stop the electroplating coating exposed electrical contact areas on the lower surface. This may be desirable depending on the method that will be used to attach the semiconductor package to the printed circuit board for which it is intended.

At step 23, the strip 10 with its semiconductor dice 3 is removed from the bath 222 and cleaned by suitable means. A block of molding resin 231 is then placed on the top surface of the substrate 10 so as to cover the semiconductor dice 3 and bond-wires 7. The strip is then cut into individual semiconductor packages 1. The action of cutting severs the connection between the bond fingers 6 and the conductive tracks 11. Where the protective layer 211 has been used, it is removed at an appropriate time during this step, the choice of which moment being within the scope of one of ordinary skill.

The choice of the alloy for the wire is governed by the ease of bonding onto the particular composition of bond pads 4. Copper at 99% purity has been shown to give acceptable results for some common structures of the bond pads 4.

The choice of the coating is governed by its own resistance to corrosion, its compatibility with the wire metal, the ease with which it can be successfully electroplated and the overall cost of the process. Also a low permeability to moisture of the resultant electroplated layer is desirable. In the case of wires of 99% copper, either a two layer coating of first titanium and then nickel or a single layer coating of silver may be used. The titanium provides a barrier to diffusion between the copper and nickel and so reduces the risk of excessive dissolution of the nickel by the copper. It also offers a good adhesion to the copper. The nickel provides a good resistance to corrosion. Silver adheres well to copper and has a relatively high resistance to corrosion. It is however a more expensive material.

There are however many other possible choices and these are within the realm of one of ordinary skill.

Figure 1:
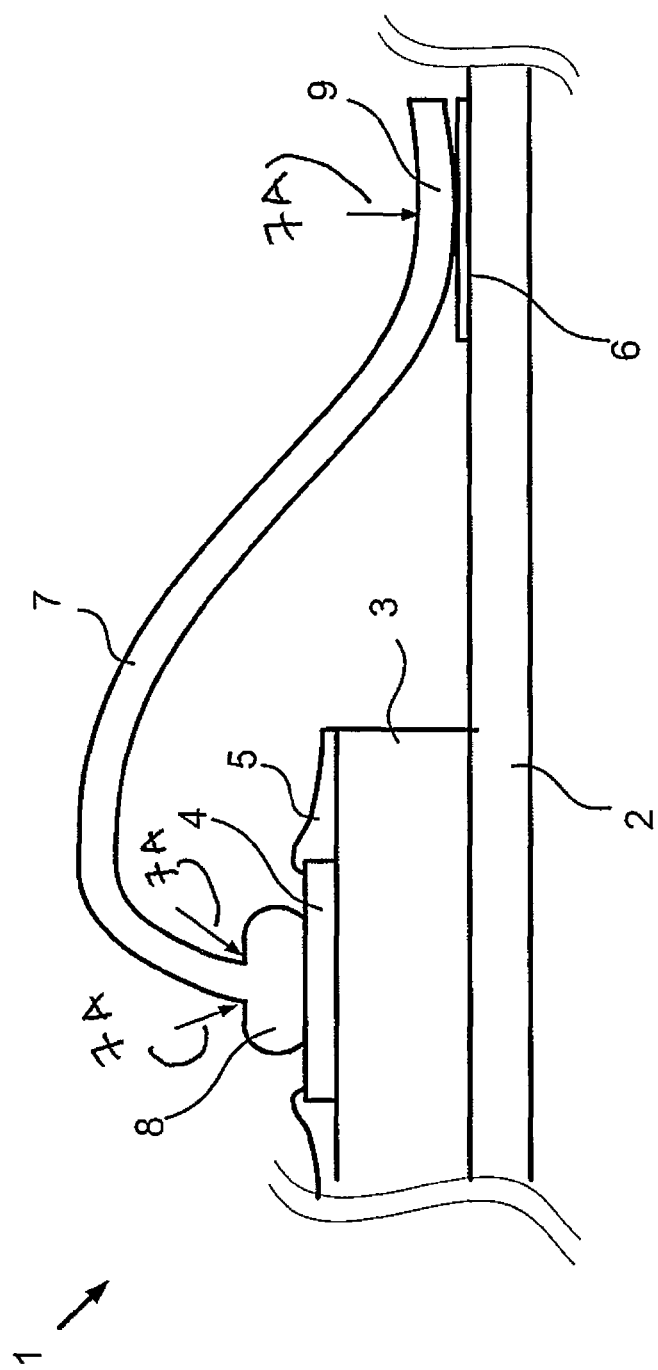
FIG. 1 represents a cross-section view of a semiconductor packages with a wire-bond made using a known technique.
Figure 4:
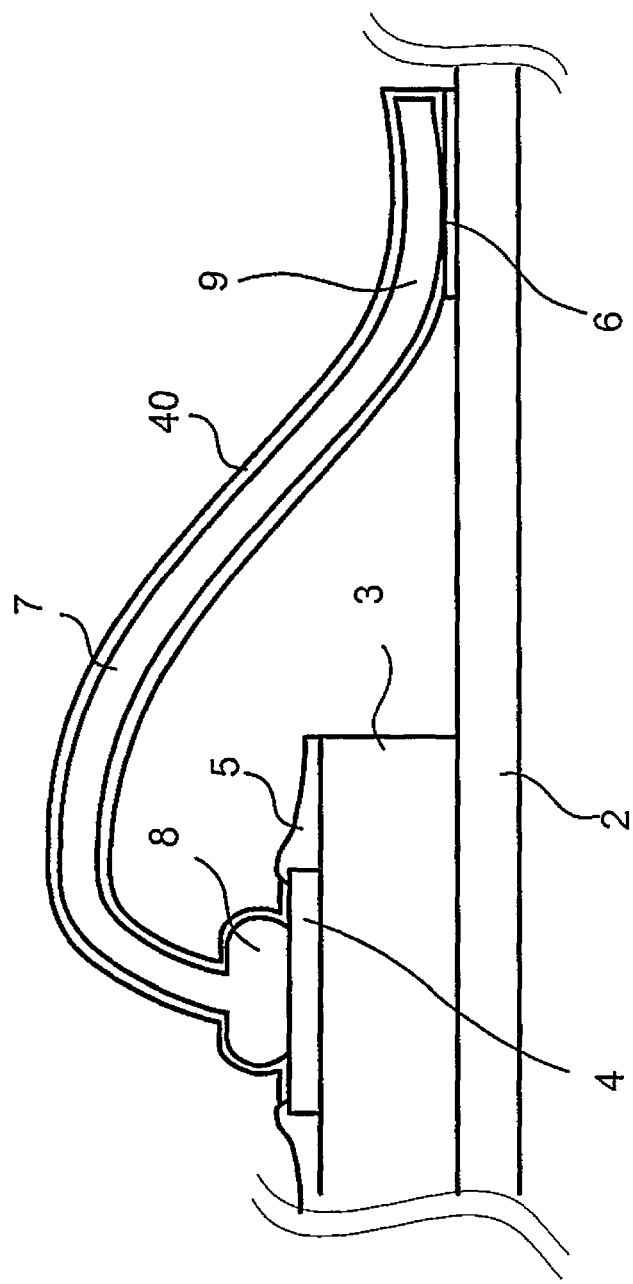
FIG. 4 represents a cross-section view of a semiconductor packages with a wire-bond according to an embodiment.

FIG. 4 represents a cross section of a semiconductor package with a bond-wire, the whole according to an embodiment. The elements already discussed in relation to FIG. 1 will not be discussed further.

There is present a coating 40 which coats, in a conformal manner all the surfaces of the bond-wire 7, including the ball 8 and the end of the stitch 9. The coating 40 also coats the exposed surface of the bond-pad 4 and the exposed area of the bond-finger 6.

As can be seen the metal coating 40 covers the whole structure of the bond-wire 7, particularly the zones around the ball 8 and the stitch 9. Thus the wire is protected from subsequent corrosion, even in these areas. The presence of the coating 40 on the bond-pad 4 and the bond-finger 6 should not be of any consequence. It may, depending on the materials used on the surfaces of these, be also beneficial.

The foregoing, with its features, aspects and purposes is given by way of illustration and not limitation. Indeed, it is not intended that the embodiments described be considered the only ones concerned by the present invention.

Indeed the structures discussed concern ball and land-grid array packages. However this technique could be adapted to other package types such as lead-frame packages, so long as the bond-fingers are all connected together when the lead-frames are in the form of the strip. This is very often the case.

Furthermore, copper bond-wires 7 and coating with them with alloys of titanium, nickel or silver have been discussed. However, other materials could be envisaged both for the wires and for the coating material, for example palladium, chromium or tin. Preferable, the material chosen should adhere well to the metal of the bond-wire 7. Also, preferably, it should resist corrosion well, which can be achieved by it being relatively inert or by it having an adhering oxide of low permeability to moisture.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended to be limiting. The invention is limited only as defined in the following claims and the equivalent thereto.

What is claimed is:

1. A semiconductor package comprising:
    a semiconductor die attached to a support having electrically conductive paths, said semiconductor die having a bond-pad electrically connected to the electrically conductive path on said support by a bond-wire of 99% pure copper, wherein an end of said bond-wire forms a connection junction on a face of said bond-pad,
    wherein said bond-wire and said connection junction are coated with a protection layer of a metallic composition, the protective layer having a first layer, the first layer being titanium, and a second layer coating the first layer, the second layer being an alloy of nickel.

2. The semiconductor package of claim 1, wherein said protection layer is made of an alloy of silver.

3. The semiconductor package of claim 1, wherein said bond-pad is coated with a protection layer of a metallic composition.

4. The semiconductor package of claim 3, wherein the protection layer also partially covers said electrically conductive path on the support.

5. The semiconductor package of claim 1, wherein said support is a substrate for a ball-grid array or a land-grid array package.

6. The semiconductor package of claim 3, wherein said protective layer on said bond-wire is at least partially contiguous with said protective layer on said bond-pad.

7. A process for manufacturing a semiconductor package, the process comprising:
    providing a plurality of supports arranged in a matrix on a larger support, each support having electrically conductive paths;
    providing a semiconductor die having bond-pads;
    then attaching said semiconductor die to one of said plurality of supports;
    then electrically connecting a bond-pad of the semiconductor die to an electrically conductive path by a bond-wire of an alloy of copper at 99% purity,
    wherein the electrically conductive paths of said plurality of supports are all electrically connected together and the process further comprises electroplating a layer of a second metallic composition onto the bond-wire and the connection junction; and
    wherein electroplating comprises electroplating a layer of titanium onto the bond-wire and the connection junction and then electroplating a layer of nickel onto the layer of titanium.

8. The process of claim 7, wherein the layer of the second metallic composition is an alloy of silver.

9. The process of claim 7, further comprising the step of attaching a connector for electroplating to a connection point on said larger support.

10. The process of claim 7, further comprising the steps of:
    before the step of electroplating, placing a protective layer on a face of said support not having said semiconductor die attached; and,
    after the step of electroplating, removing said protective layer.

11. The process of claim 7, further comprising the steps of:
    after the step of electroplating, placing a block of molding resin on said larger support such that said semiconductor die and said bond-wire are completely covered; and then
    sawing said larger support so that said supports are rendered separate.

* * * * *